United States Patent
Laloe et al.

(10) Patent No.: US 8,803,254 B2
(45) Date of Patent: Aug. 12, 2014

(54) METHODS OF FORMING REPLACEMENT GATE STRUCTURES FOR NFET SEMICONDUCTOR DEVICES AND DEVICES HAVING SUCH GATE STRUCTURES

(71) Applicant: GLOBALFOUNDRIES Inc., Grand Cayman (KY)

(72) Inventors: Jean-Baptiste Laloe, Saratoga Springs, NY (US); Huang Liu, Mechanicville, NY (US); Wonwoo Kim, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/687,355

(22) Filed: Nov. 28, 2012

(65) Prior Publication Data

US 2014/0145274 A1    May 29, 2014

(51) Int. Cl.
*H01L 21/02*   (2006.01)

(52) U.S. Cl.
USPC ............................................... 257/410

(58) Field of Classification Search
USPC ....................................... 257/410
See application file for complete search history.

(56) References Cited

U.S. PATENT DOCUMENTS

| | | | |
|---|---|---|---|
| 6,140,688 A | 10/2000 | Gardner et al. | |
| 6,365,057 B1 | 4/2002 | Whitehurst et al. | |
| 7,736,965 B2 | 6/2010 | Cheng et al. | |
| 2009/0114671 A1* | 5/2009 | Finnestad et al. | 221/102 |
| 2011/0140206 A1* | 6/2011 | Lin et al. | 257/411 |
| 2012/0163103 A1 | 6/2012 | Hafez et al. | |
| 2012/0168754 A1 | 7/2012 | Le Neel et al. | |
| 2012/0261770 A1* | 10/2012 | Lin et al. | 257/410 |
| 2013/0040160 A1 | 2/2013 | Liu et al. | |

* cited by examiner

*Primary Examiner* — Mark A. Laurenzi, III
*Assistant Examiner* — Mounir Amer
(74) *Attorney, Agent, or Firm* — Amerson Law Firm, PLLC

(57) ABSTRACT

One illustrative gate structure for an NFET device includes a gate insulation layer formed above a semiconducting substrate, a first metal layer comprised of titanium nitride (TiN) positioned above the gate insulation layer, a second metal layer comprised of tantalum nitride (TaN) positioned above the first metal layer, a third metal layer comprised of titanium aluminum (TiAl) positioned above the second metal layer, a fourth metal layer comprised of an aluminum-containing material positioned above the third metal layer, a fifth metal layer comprised of titanium positioned above the fourth metal layer, and a layer of aluminum positioned above the fifth metal layer.

11 Claims, 7 Drawing Sheets

METHODS OF FORMING REPLACEMENT GATE STRUCTURES FOR NFET SEMICONDUCTOR DEVICES AND DEVICES HAVING SUCH GATE STRUCTURES

BACKGROUND OF THE INVENTION

1. Field of the Invention

Generally, the present disclosure relates to the manufacture of sophisticated semiconductor devices, and, more specifically, to various methods of forming replacement gate structures for NFET semiconductor devices and devices having such replacement gate structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce so-called short channel effects. Also, in a FinFET, the junction capacitance at the drain region of the device is greatly reduced, which tends to reduce at least some short channel effects.

For many previous device technology generations, the gate electrode structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short channel effects which may be associated with the use of traditional silicon-based materials in reduced channel length transistors. For example, in some aggressively scaled transistor elements, which may have channel lengths on the order of approximately 10-20 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

Figure 1A:
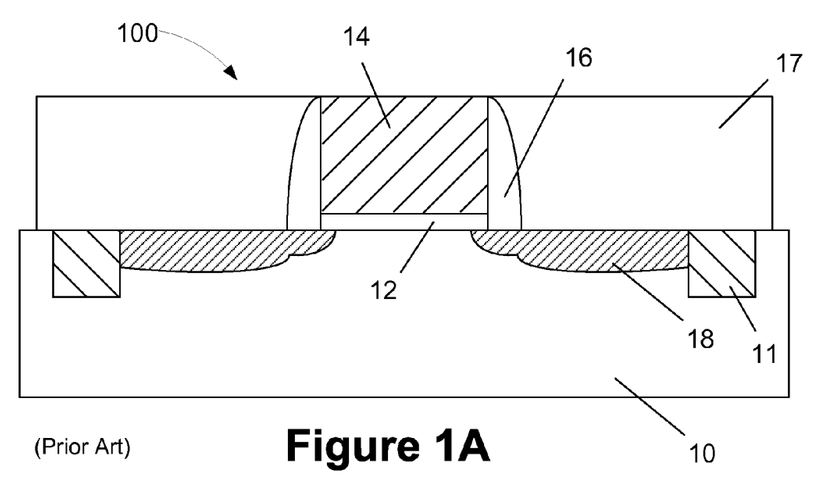
FIGS. 1A-1D depict one illustrative prior art process flow for forming a semiconductor device using a so-called "gate last" or "replacement gate" approach.

One well-known processing method that has been used for forming either planar or 3D transistors with a high-k/metal gate structure is the so-called "gate last" or "replacement gate" technique. FIGS. 1A-1D depict one illustrative prior art method for forming an HK/MG replacement gate structure using a gate last technique for an illustrative planar transistor device 100. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NFET devices and P-type dopants for PFET devices) that are implanted into the substrate 10 using known masking and ion implantation techniques. Of course, those skilled in the art will recognize that there are other features of the transistor 100 that are not depicted in the drawings for purposes of clarity. For example, so-called halo implant regions are not depicted in the drawings, as well as various layers or regions of silicon/germanium that are typically found in high performance PFET transistors. At the point of fabrication depicted in FIG. 1A, the various structures of the device 100 have been formed and a chemical mechanical polishing process (CMP) has been performed to remove any materials above the sacrificial gate electrode 14 (such as a protective cap layer (not shown) comprised of silicon nitride) so that at least the sacrificial gate electrode 14 may be removed.

Figure 1B:
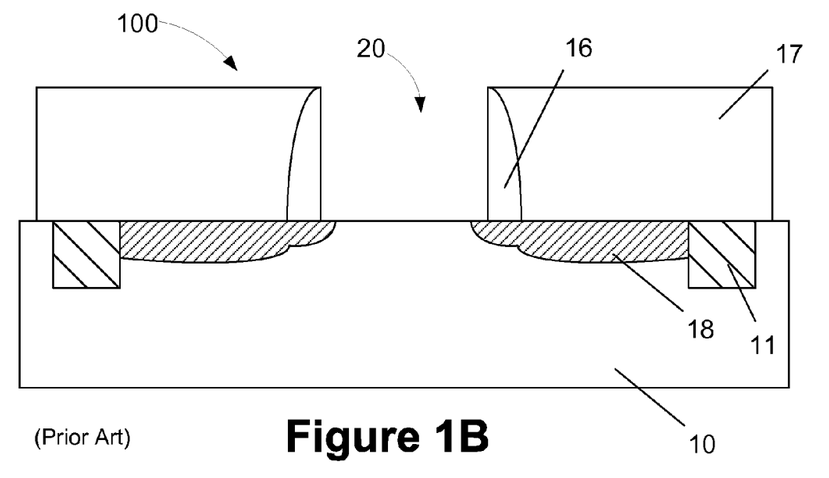

As shown in FIG. 1B, one or more etching processes are performed to remove the sacrificial gate electrode 14 and the sacrificial gate insulation layer 12 to thereby define a gate cavity 20 where a replacement gate structure will subsequently be formed. A masking layer that may be employed in such etching processes is not depicted for purposes of clarity. Typically, the sacrificial gate insulation layer 12 is removed as part of the replacement gate technique, as depicted herein. However, the sacrificial gate insulation layer 12 may not be removed in all applications.

Figure 1C:
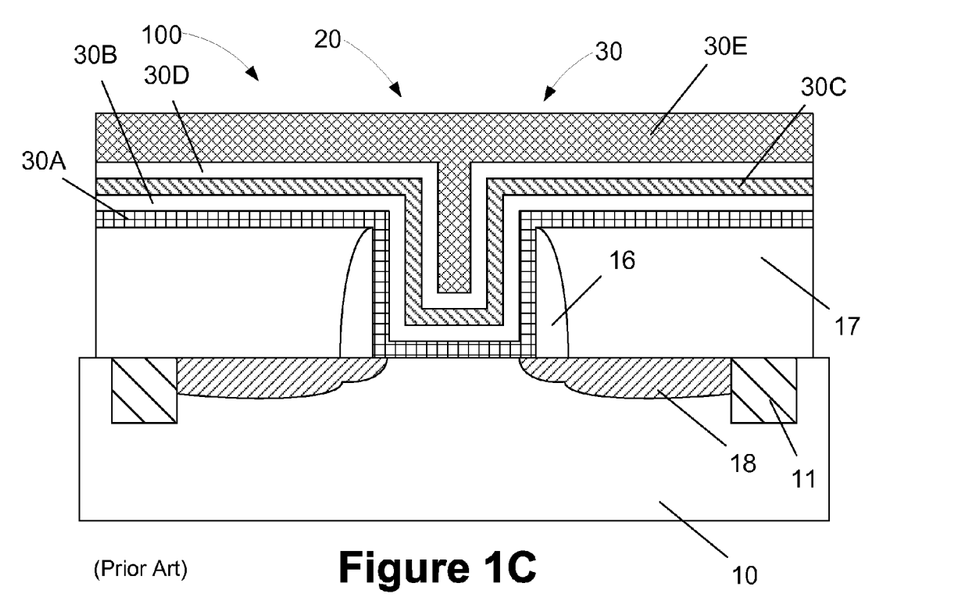
Figure 1D:
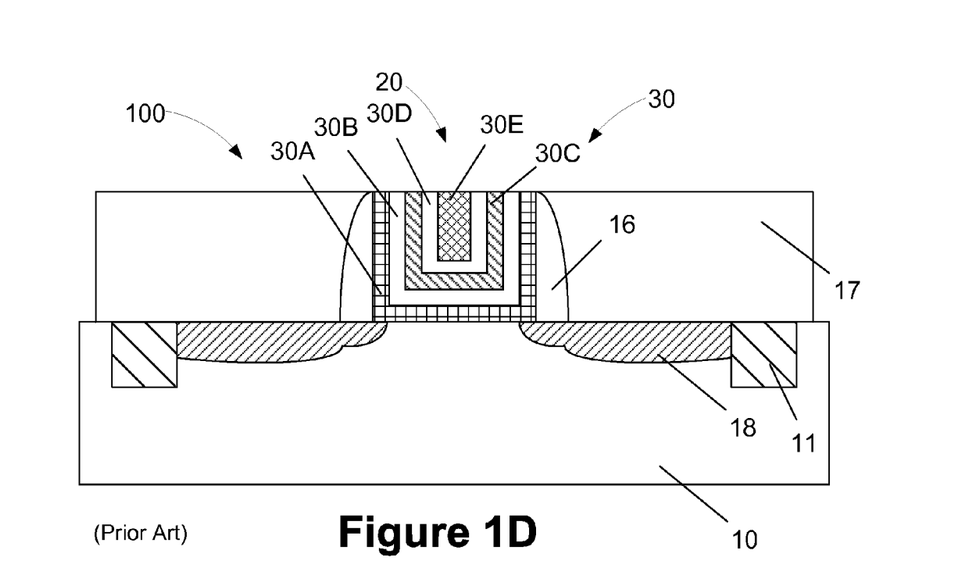

Next, as shown in FIG. 1C, various layers of material that will constitute a replacement gate structure 30 are formed in the gate cavity 20. The materials used for such replacement gate structures 30 may vary depending upon the particular application. Even in cases where the sacrificial gate insulation layer 12 is intentionally removed, there will typically be a very thin native oxide layer (not shown) that forms on the substrate 10 within the gate cavity 20. In one illustrative example, the replacement gate structure 30 is comprised of a high-k gate insulation layer 30A, such as hafnium oxide, and first, second and third metal layers 30B, 30C and 30D, respectively, that are conformably deposited above the device and in the gate cavity 20. Also depicted in FIG. 1C is an illustrative bulk metal layer 30E, such as aluminum, that is deposited so as to fill the remaining unfilled portion of the gate cavity 20. Ultimately, as shown in FIG. 1D, one or more CMP processes are performed to remove excess portions of the gate insulation layer 30A and the layers 30B, 30C, 30D and 30E positioned outside of the gate cavity 20 to thereby define the replacement gate structure 30. The various layers of the replacement gate structure 30 may be made of a variety of different materials depending upon the particular application and/or the type of device under construction.

Figure 1E:
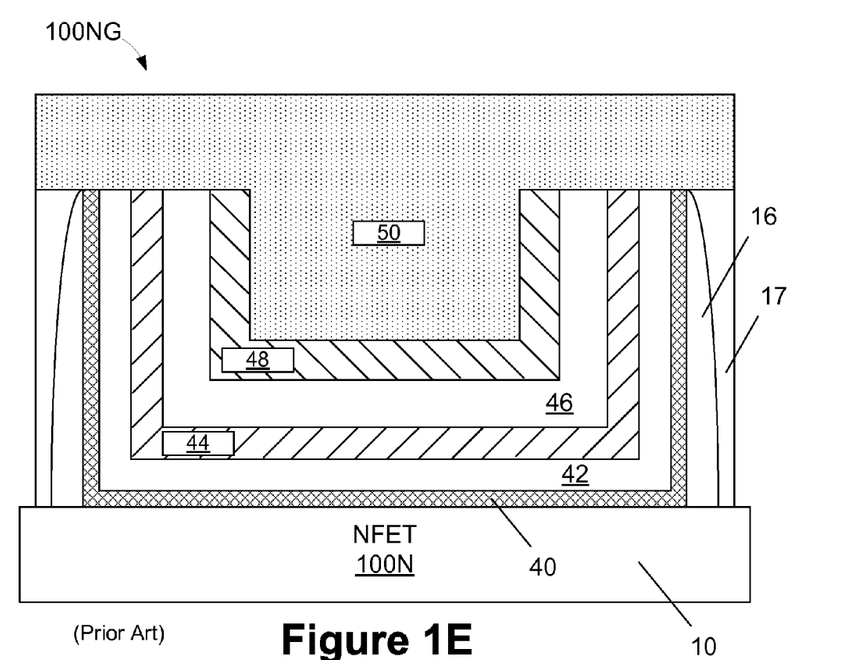
FIGS. 1E-1F are enlarged views of a replacement gate structure for an illustrative prior art NFET device.

FIG. 1E is an enlarged view of an illustrative replacement gate structure 100NG for an illustrative NFET transistor 100N. In one illustrative example, the replacement gate structure 100NG is comprised of a high-k gate insulation layer 40, such as hafnium oxide, having a thickness of approximately 2 nm or less, a first metal layer 42 (e.g., a layer of titanium nitride (TiN) with a thickness of about 1-2 nm), a second metal layer 44 (e.g., a layer of tantalum nitride (TaN) with a thickness of about 1-2), a third metal layer 46 (e.g., a layer of titanium-aluminum (TiAl (1:1)) with a thickness of about 10 nm), a fourth metal layer 48 (e.g., a layer of titanium (Ti) with a thickness of about 6 nm) and a bulk metal layer 50, such as aluminum. For ease of illustration, other than the bulk metal layer 50, the portions of the various layers of material shown in FIG. 1E that are deposited above the upper surface of the layer of insulating material 17 are not depicted in FIG. 1E. An illustrative PFET device (not shown) typically includes an additional layer of metal (not shown) to those formed for the NFET device 100N, such as a relatively thick layer of titanium nitride (with a thickness of about 5 nm) positioned between the second metal layer 44 (TaN) and the third metal layer 46 (TiAl (1:1)). The gate insulation layer 40 may be formed by performing a conformal chemical vapor deposition (CVD) process. The various layers of metal shown in FIG. 1E may be formed by performing various physical vapor deposition (PVD) processes using the appropriate metal targets. In forming integrated circuit products that have both NFET and PFET devices, with the exception of the additional layer of metal noted above for the PFET device, all of the materials are formed on both of the NFET and PFET devices in common process operations. When it is time to form the additional layer of metal for the PFET devices only, the NFET devices are masked using known masking techniques.

In the NFET device 100N, the aluminum in the third metal layer 46 (titanium-aluminum (TiAl (1:1)) is the work-function adjusting material, i.e., it is used to reduce the threshold voltage of the NFET device 100N. The work-function adjusting material for the PFET device (not shown) is the first metal layer 42 (titanium nitride (TiN)). More specifically, the aluminum in the third metal layer 46 (TiAl) is used to lower the work-function of the NFET device 100N, which is desirable for such an NFET device. However, aluminum also tends to lower the work-function for the PFET device, which is undesirable for the PFET device. Thus, the PFET device includes the additional layer of metal, e.g., the relatively thick layer of titanium nitride positioned between the second metal layer 44 (TaN) and the third metal layer 46 (TiAl) so as to block or reduce the chances of aluminum migrating toward the channel region of the PFET device.

Figure 1F:
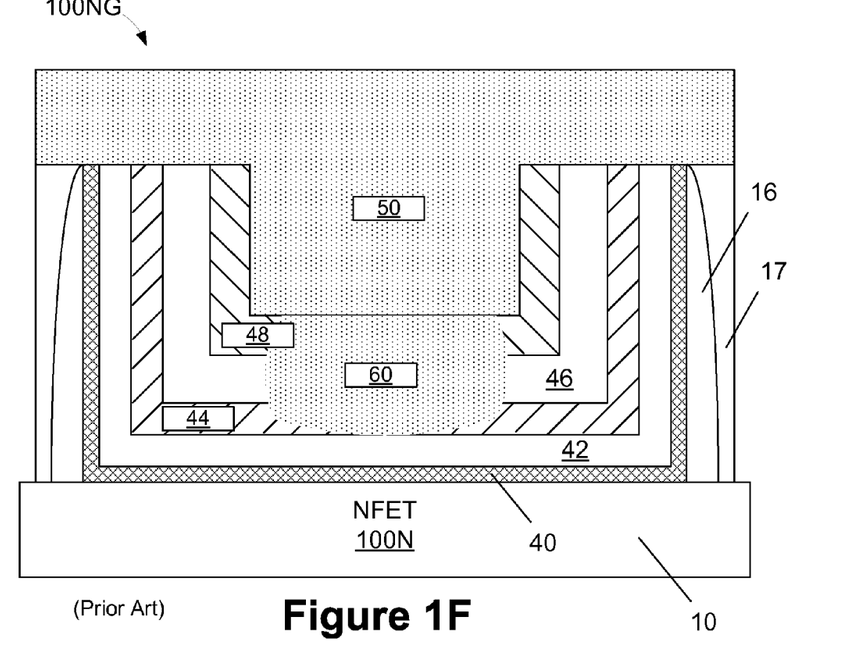

As shown in FIG. 1F, after the various layers shown in FIG. 1E are formed, a reflow or heating process is performed so as to drive aluminum, as schematically depicted by the region 60, from the third metal layer 46 (TiAl) and the bulk aluminum layer 50 toward the channel region of the NFET device 100N. The reflow process may be performed at a temperature of about 400° C. for a duration of about 2 minutes. After the reflow process, titanium-aluminum (TiAl) will readily form just above the gate insulation layer 40 due to the migration of aluminum. Unfortunately, this thermal diffusion of aluminum is a difficult process to control and stop. There are several risks involved in adjusting the work-function of the NFET device 100N using this approach. For example, if the diffusion of aluminum is not precisely controlled so as to limit the extent of the aluminum diffusion, problems such as gate leakage, gate punch through (aluminum spiking into the silicon channel region) and potential degradation of the PFET device may occur.

The present disclosure is directed to various methods of forming replacement gate structures for NFET semiconductor devices and devices having such replacement gate structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures for NFET semiconductor devices and devices having such replacement gate structures. In one example, the gate structure for an NFET device includes a gate insulation layer formed above a semiconducting substrate, a first metal layer comprised of titanium nitride (TiN) positioned above the gate insulation layer, a second metal layer comprised of tantalum nitride (TaN) positioned above the first metal layer, a third metal layer comprised of titanium aluminum (TiAl) positioned above the second metal layer, a fourth metal layer comprised of an aluminum-containing material positioned above the third metal layer, a fifth metal layer comprised of titanium positioned above the fourth metal layer, and a layer of aluminum positioned above the fifth metal layer.

In another example, the gate structure for an NFET device includes a gate insulation layer formed above a semiconducting substrate, a first metal layer comprised of titanium nitride (TiN) positioned above the gate insulation layer, a second metal layer comprised of tantalum nitride (TaN) positioned above the first metal layer, a third metal layer comprised of TiAl$_3$ positioned above the second metal layer, a fourth metal layer comprised of titanium positioned above the third metal layer, and a layer of aluminum positioned above the fourth metal layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming replacement gate structures for NFET semiconductor devices and devices having such replacement gate structures. As will be readily apparent to those skilled in the art upon a complete reading of the present application, the presently disclosed methods and devices may be employed when manufacturing a variety of different devices, including, but not limited to, logic devices, memory devices, ASICs, etc. With reference to the attached drawings, various illustrative embodiments of the methods and devices disclosed herein will now be described in more detail.

The inventions described herein will be disclosed in the context of making an illustrative planar transistor device. However, as will be appreciated by those skilled in the art after a complete reading of the present application, the method and resulting gate structures disclosed herein may be employed with other types of transistor devices, e.g., 3D devices, such as FinFET devices. Thus, the inventions disclosed herein should not be considered to be limited to any particular type of semiconductor device. To the extent that the drawings discussed below include the same reference numbers as used in FIGS. 1A-1F, the discussion regarding those common features applies equally to the drawing discussed below.

Figure 2A:
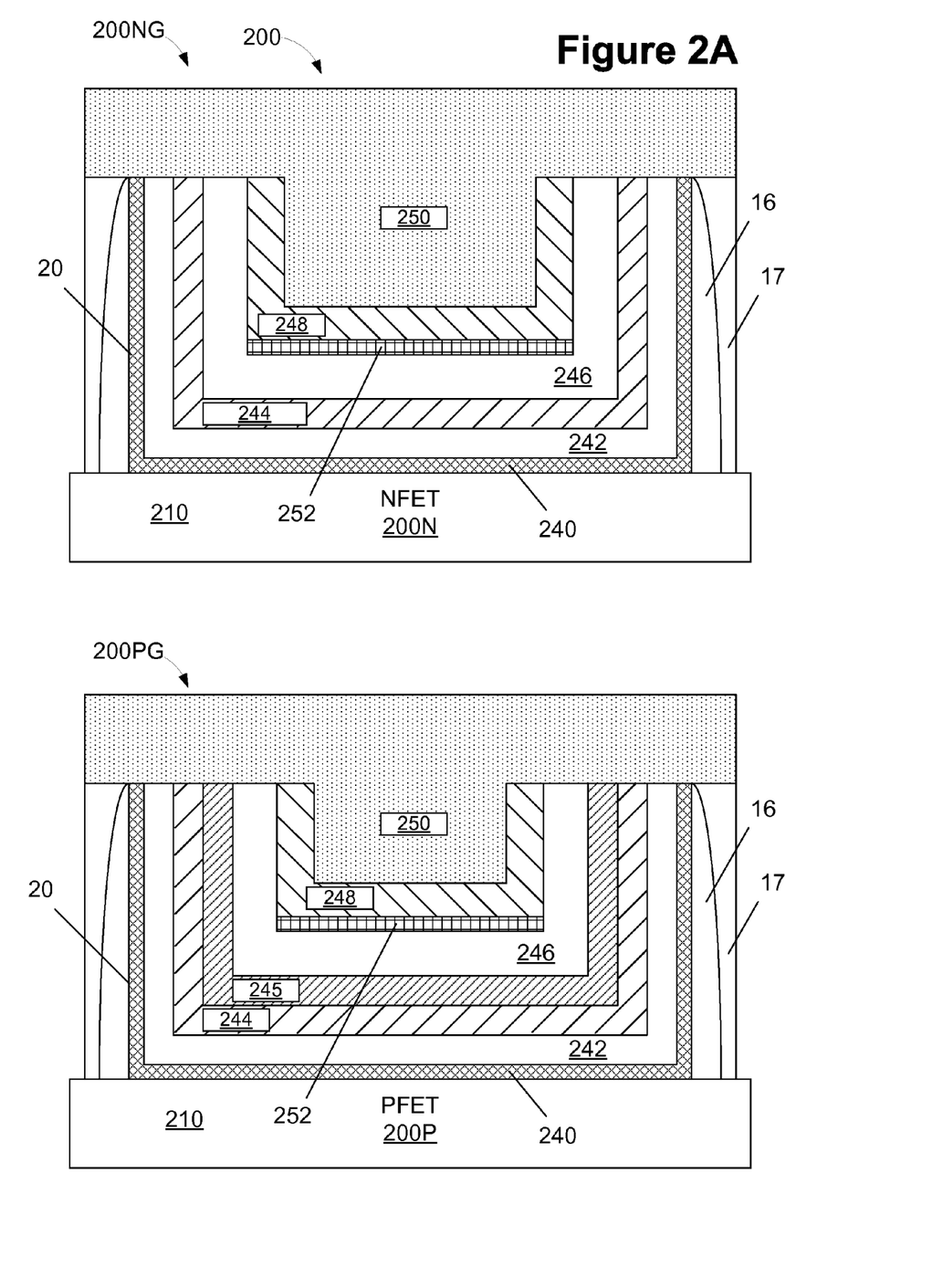
FIGS. 2A-2B depict one illustrative method disclosed herein of forming a replacement gate structure for an NFET device and the resulting device.
Figure 2B:
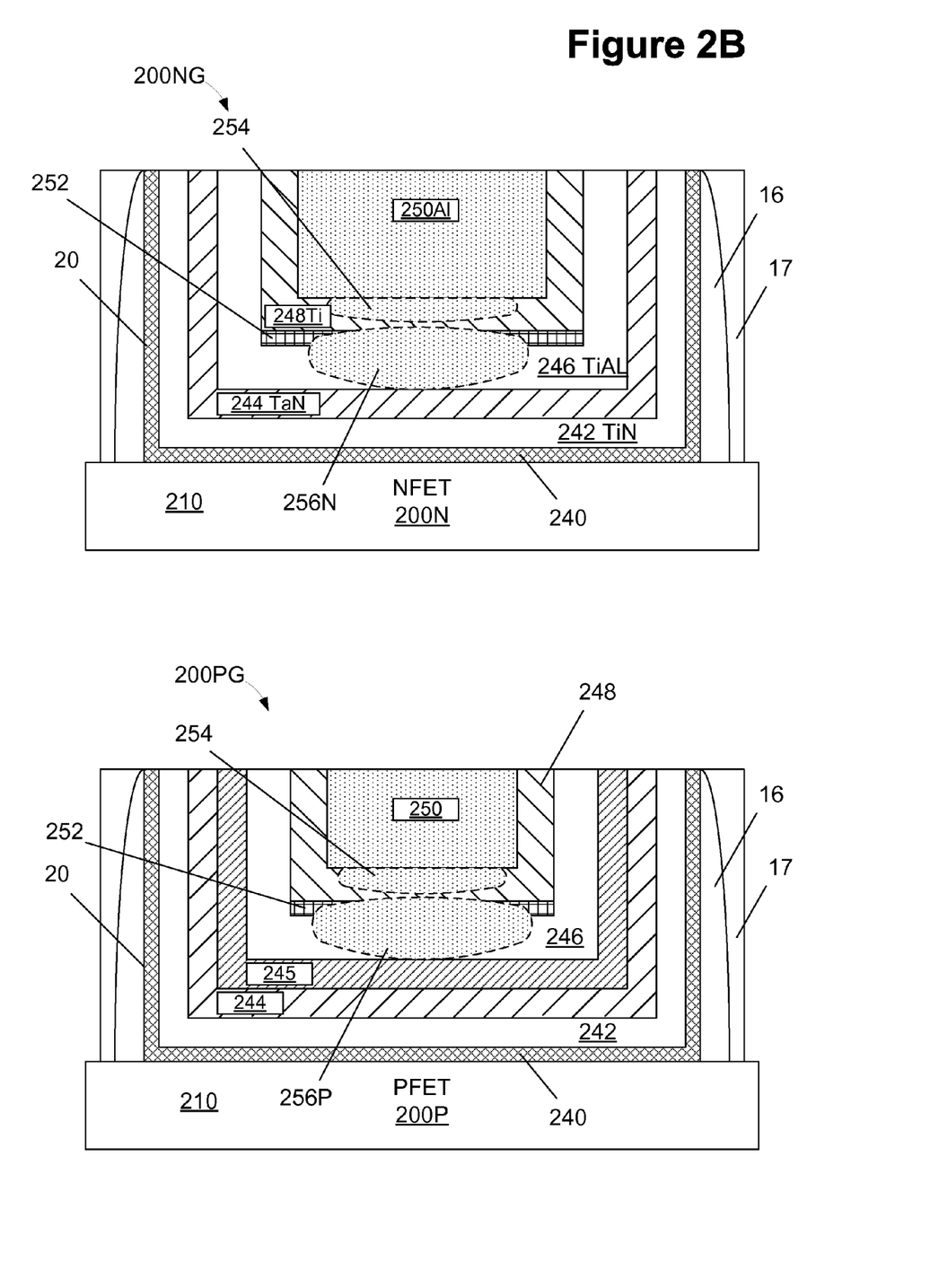

FIGS. 2A-2B are enlarged, cross-sectional views of an illustrative semiconductor device 200 comprised of an illustrative NFET device 200N and an illustrative PFET device 200P. Also depicted in FIGS. 2A-2B are illustrative embodiments of a replacement gate structure 200NG for the NFET transistor 200N and an illustrative replacement gate structure 200PG for the PFET device 200P. The device 200 is formed above a semiconducting substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor structures. The substrate 210 may also be made of materials other than silicon.

FIGS. 2A-2B depict the device 200 at the point in fabrication wherein a plurality of gate cavities 20 have been formed using, for example, the techniques disclosed in the background section of this application, and after various layers of material that will be part of the replacement gate structures for the devices 200N, 200P have been formed in the gate cavities 20. Of course, many other process operations will have been already performed on the device 200, e.g., the formation of isolation regions, source/drain regions, etc., but such details are not depicted in the following drawings so as not to obscure the inventions disclosed herein.

The replacement gate structures 200NG, 200PG have many common layers of material. For example, in the embodiments shown in FIGS. 2A-2B, the gate structures 200NG and 200PG have the following layers of material in common: a high-k gate insulation layer 240, such as hafnium oxide (or any of the other high-k materials identified in the background section of this application), having a thickness of approximately 2 nm or less, a first metal layer 242 (e.g., a layer of titanium nitride (TiN) with a thickness of about 1-2 nm), a second metal layer 244 (e.g., a layer of tantalum nitride (TaN) with a thickness of about 1-2), a third metal layer 246 (e.g., a layer of titanium-aluminum (TiAl (1:1)) with a thickness of about 10 nm), a fourth metal layer 248 (e.g., a layer of titanium (Ti) with a thickness of about 6 nm) and a bulk metal layer 250, such as aluminum. The replacement gate structure 200PG for the PFET 200P also includes a layer of metal 245, e.g., a relatively thick layer of titanium nitride (with a thickness of about 5 nm) positioned between the second metal layer 244 (TaN) and the third metal layer 246 (TiAl (1:1)). This layer of metal 245 is not present in the gate structure 200NG for the NFET device 200N.

Both of the gate structures 200NG, 200PG also include an aluminum-containing layer 252 formed on the third metal layer 246. In one illustrative embodiment, the aluminum-containing layer 252 may be a layer of aluminum or a layer of TiAl$_3$ having a thickness on the order of about 1-2 nm. Typically, the thickness of the aluminum-containing layer 252 is typically so thin that little if any of the material of the aluminum-containing layer 252 will form on the vertical sidewalls of the third metal layer 246. However, if desired, the thickness of the aluminum-containing layer 252 may be formed to such a thickness that some of the material will form on the sidewalls of the vertical sidewalls of the third metal layer 246. For ease of illustration, other than the bulk metal layer 250, the portions of the various layers of material shown in FIG. 2A that are deposited above the upper surface of the layer of insulating material 17 are not depicted in the drawings.

The various layers of material depicted in FIGS. 2A-2B may be formed by performing a variety of known processing techniques. For example, the gate insulation layer 240 may be formed by performing a conformal CVD or atomic layer deposition (ALD) process. The various layers of metal shown in FIGS. 2A-2B may be formed by performing various PVD processes using the appropriate metal targets. In forming the device 200, with the exception of the additional metal layer 245 for the PFET device 200N, all of the materials are formed on both of the NFET and PFET devices 200N, 200P in common process operations. When it is time to form the layer of metal 245 selectively for PFET device 200P only, the NFET device 200N is masked using known masking techniques.

FIG. 2B depicts the device 200 after several process operations have been performed. First, after the various layers of material shown in FIG. 2A are formed, a reflow or heating process was performed on the device 200 and then one or more chemical mechanical polishing (CMP) processes were performed to remove excess portions of the various layers of material positioned outside of the gate cavity 20 to thereby define the replacement gate structures 200NG, 200PG. The heating process may be performed at a temperature of about 400° C. for a duration of about 2 minutes.

The purpose of the heating process is two-fold. First, the heating process is performed to reflow the various metal layers, including the bulk metal layer 250, in an effort to fill any voids that may have formed in the gate cavity 20 as the various layers of material were formed. Second, the heating process is performed to drive aluminum from the aluminum-containing layer 252 and the third metal layer 242 (TiAl) toward the channel region of the NFET device 200N to adjust the work-function of the NFET device so as to enhance its performance capabilities. This thermal diffusion of aluminum is reflected by the schematically depicted aluminum diffuse region 256N (surrounded by dashed lines) in FIG. 2B.

In one illustrative embodiment, this diffusion region 256N stops approximately at the interface between the second metal layer 244 and the third metal layer 246 on the NFET device 200N. Also depicted in FIG. 2B is a diffusion region 254 from the bulk aluminum layer 250. Note the presence of the metal layer 245, e.g., titanium nitride, in the PFET device 200P limits the extent of the aluminum diffusion region 256P in the PFET device, i.e., the metal layer 245 acts to block or limit the migration of aluminum on the PFET device 200P. In this embodiment, the aluminum-containing layer 252 acts a source of aluminum that may be used to set the work-function of the NFET device 200N. With the aluminum-containing layer 252 in the gate stack 200NG, the thickness of the metal layer 248 (Ti) can be tailored to provide better bottom and sidewall coverage. In the prior art NFET device 100 discussed in the background section of this application, the thickness of the titanium layer 48 was typically very thin, e.g., 4-6 nm so as to insure that it did not block desirable aluminum diffusion from the bulk aluminum layer 50. Due to the source of aluminum provided by the aluminum-containing layer 252, the thickness of the titanium layer 248 in the embodiment disclosed in FIGS. 2A-2B is independent of any concerns regarding aluminum diffusion, and it may be adjusted as desired to improve other aspects of the device 200. For example, by making the titanium layer 248 thicker, better sidewall coverage may be achieved when forming the titanium layer 248, which may improve the wetting functions of the titanium layer 248 and thereby lead to better filling by the metal layer 250.

At the point of fabrication depicted in FIG. 2B, traditional manufacturing operations may be performed to complete the formation of the device 200. For example, contact openings (not shown) may be formed through the layer of insulating material 17 to expose the underlying source/drain regions (not shown). Thereafter metal silicide regions (not shown) may be formed on the exposed portions of the source/drain regions and conductive contacts (not shown) may be formed in the contact openings to provide electrical connection to the source/drain regions. Various metallization layers may then be formed above the device 200 using known processing techniques.

Figure 3A:
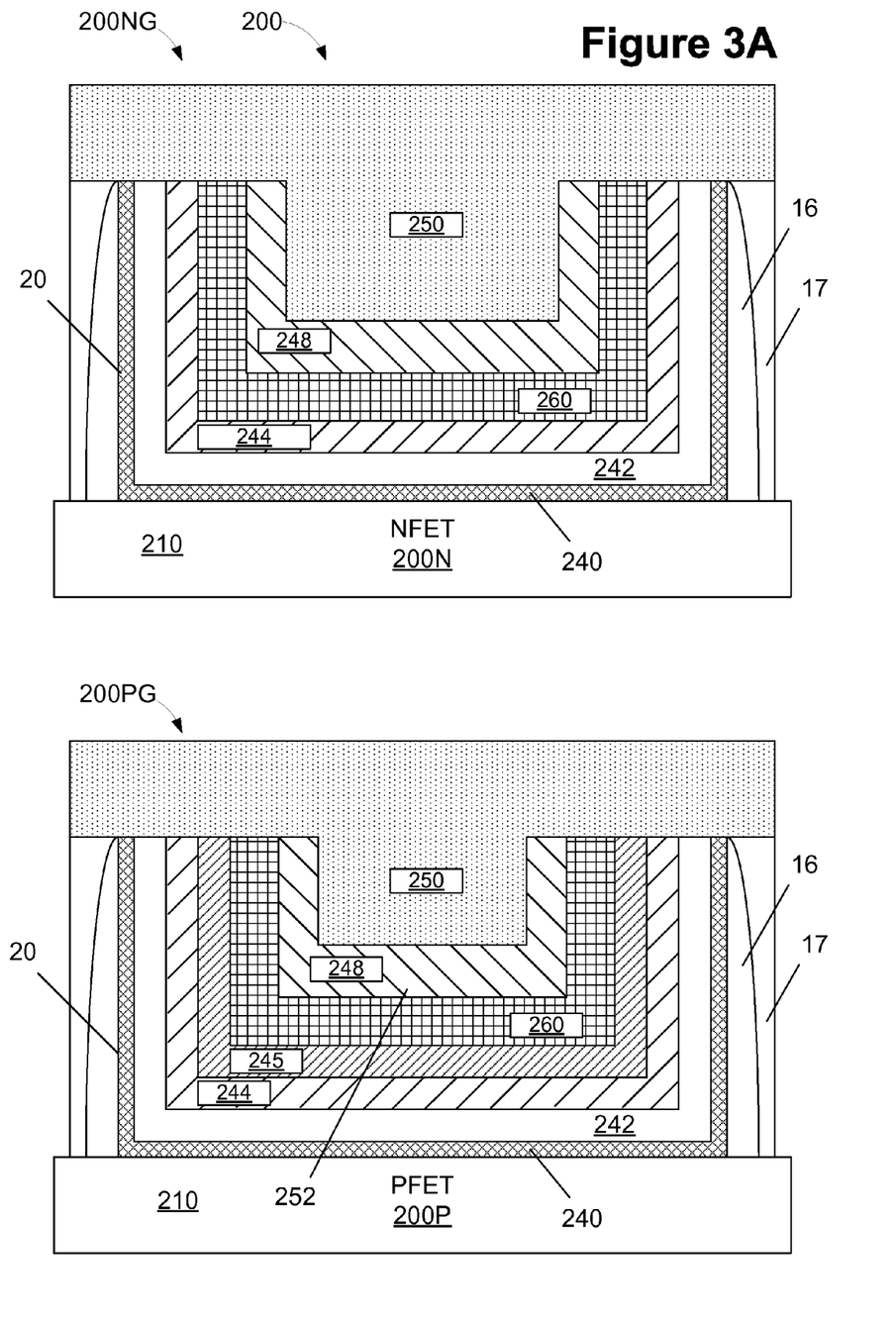
FIGS. 3A-3B depict another illustrative method disclosed herein of forming a replacement gate structure for an NFET device and the resulting device.
Figure 3B:
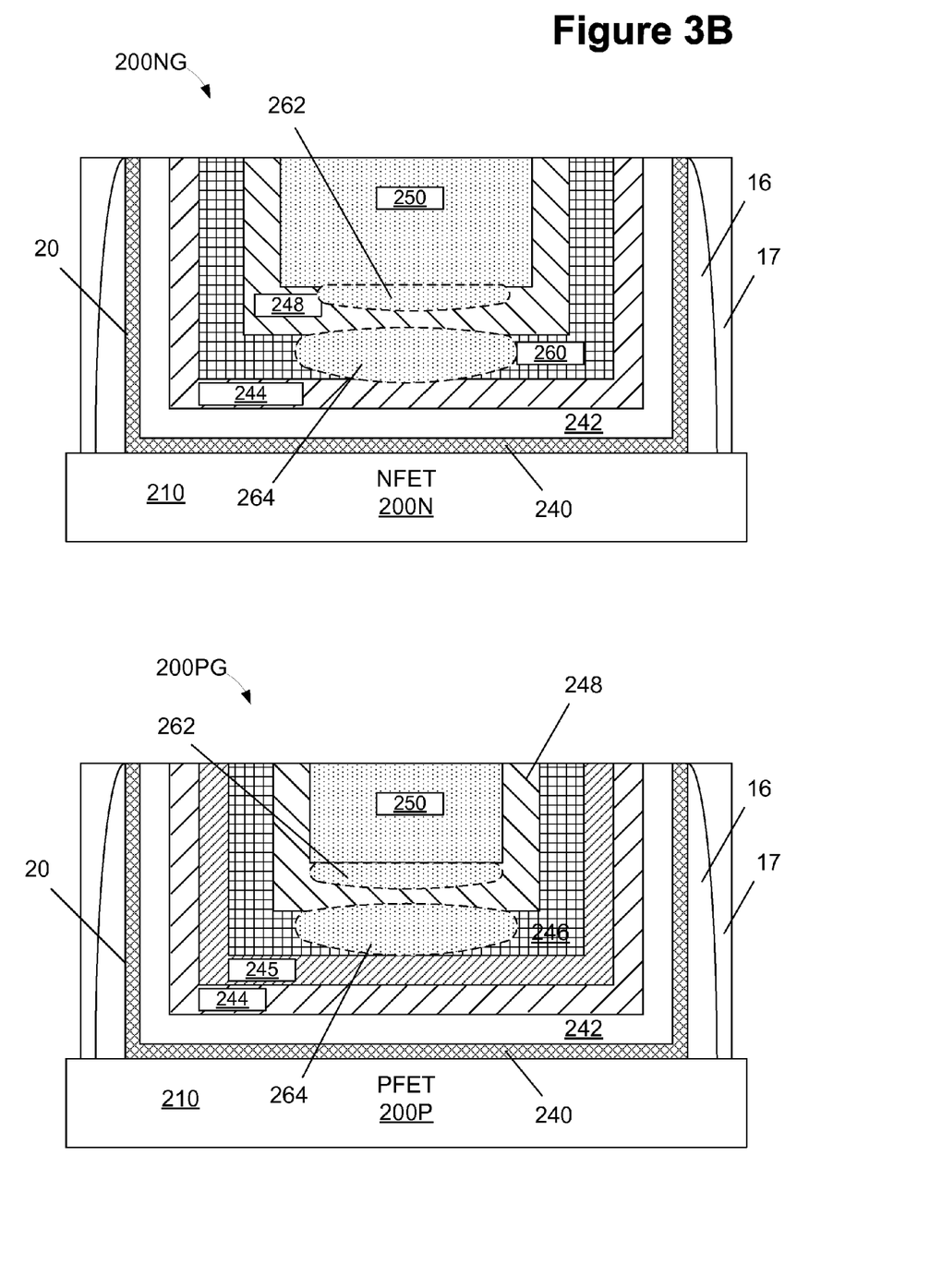

FIGS. 3A-3B are enlarged, cross-sectional views of another illustrative embodiment of the semiconductor device 200 comprised of an illustrative NFET device 200N and an illustrative PFET device 200P. In this illustrative embodiment, relative to the embodiments discussed above with respect to FIGS. 2A-2B, the titanium-aluminum (Ti—Al) metal layer 246 has been omitted and replaced by a layer of Ti—Al$_3$ 260 having a thickness of about 8-12 nm. Also, in this embodiment, the aluminum-containing layer 252 has been omitted. Ti—Al$_3$ is the most easily formed titanium-aluminum compound at the process conditions and temperatures encountered in forming replacement gate structures. The Ti—Al$_3$ layer 260 serves as a barrier from aluminum diffusion from the bulk aluminum layer 250 and little if any aluminum is reflowed into the gate of the NFET device 200N from the Ti—Al$_3$ layer.

FIG. 3B depicts the device 200 after several process operations have been performed. First, after the various layers of material shown in FIG. 3A are formed, a reflow or heating process was performed on the device 200 and then one or more chemical mechanical polishing (CMP) processes were performed to remove excess portions of the various layers of material positioned outside of the gate cavity 20 to thereby define the replacement gate structures 200NG, 200PG. The heating process may be performed at a temperature of about 400° C. for a duration of about 2 minutes. FIG. 3B schematically depicts the thermal diffusion of aluminum in this embodiment. More specifically, the schematically depicted aluminum diffusion region 262 (surrounded by dashed lines) in FIG. 3B depicts the diffusion of aluminum from the bulk aluminum layer 250, while the diffusion region 264 reflects the limited diffusion of aluminum from the Ti—Al$_3$ layer 260.

At the point of fabrication depicted in FIG. 3B, traditional manufacturing operations may be performed to complete the formation of the device 200. For example, contact openings (not shown) may be formed through the layer of insulating material 17 to expose the underlying source/drain regions (not shown). Thereafter metal silicide regions (not shown) may be formed on the exposed portions of the source/drain regions and conductive contacts (not shown) may be formed in the contact openings to provide electrical connection to the source/drain regions. Various metallization layers may then be formed above the device 200 using known processing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A gate structure for an NFET device, comprising:
   a gate insulation layer formed above a semiconducting substrate;
   a first metal layer made of titanium nitride (TiN) positioned on and in contact with an upper surface of said gate insulation layer;
   a second metal layer made of tantalum nitride (TaN) positioned on and in contact with an upper surface of said first metal layer;
   a third metal layer made of titanium aluminum (TiAl) positioned on and in contact with an upper surface of said second metal layer;
   a fourth metal layer made of an aluminum-containing material positioned on and in contact with an upper surface of said third metal layer;
   a fifth metal layer made of titanium positioned on and in contact with an upper surface of said fourth metal layer; and
   an aluminum-containing layer positioned on and in contact with an upper surface of said fifth metal layer.

2. The device of claim 1, wherein said gate insulation layer is comprised of a layer of high-k insulating material.

3. The device of claim 1, wherein said fourth metal layer is a layer of aluminum (Al) or TiAl$_3$.

4. The device of claim 1, wherein said first metal layer has a thickness of about 1-2 nm, said second metal layer has a thickness of about 1-2 nm, said third metal layer has a thickness of about 10 nm, said fourth metal layer has a thickness of about 1-2 nm and said fifth metal layer has a thickness of at least about 5 nm.

5. The device of claim 1, wherein said NFET device is a planar transistor device.

6. The device of claim 1, wherein said NFET device is a FinFET device.

7. A gate structure for an NFET device, comprising:
   a gate insulation layer comprised of a high-k insulating material formed on a semiconducting substrate;
   a first metal layer made of titanium nitride (TiN) positioned on and in contact with an upper surface of said gate insulation layer;
   a second metal layer made of tantalum nitride (TaN) positioned on and in contact with an upper surface of said first metal layer;
   a third metal layer made of titanium aluminum (TiAl) positioned on and in contact with an upper surface of said second metal layer;
   a fourth metal layer made of aluminum or TiAl$_3$ positioned on and in contact with an upper surface of said third metal layer;
   a fifth metal layer made of titanium positioned on and in contact with an upper surface of said fourth metal layer; and
   an aluminum-containing layer positioned on and in contact with an upper surface of said fifth metal layer.

8. The device of claim 7, wherein said first metal layer has a thickness of about 1-2 nm, said second metal layer has a thickness of about 1-2 nm, said third metal layer has a thickness of about 10 nm, said fourth metal layer has a thickness of about 1-2 nm and said fifth metal layer has a thickness of at least about 5 nm.

9. A gate electrode structure for a planar NFET device, consisting of:
   a gate insulation layer formed above a semiconducting substrate;
   a first metal layer made of titanium nitride (TiN) positioned on and in contact with an upper surface of said gate insulation layer, wherein said first metal layer has a thickness of about 1-2 nm;
   a second metal layer made of tantalum nitride (TaN) positioned on and in contact with an upper surface of said first metal layer, wherein said second metal layer has a thickness of about 1-2 nm;
   a third metal layer made of TiAl$_3$ positioned on and in contact with an upper surface of said second metal layer, wherein said third metal layer has a thickness of about 10 nm;
   a fourth metal layer made of titanium (Ti) positioned on and in contact with an upper surface of said third metal layer, wherein said fourth metal layer has a thickness of at least about 5 nm; and
   an aluminum-containing layer positioned on and in contact with an upper surface of said fourth metal layer.

10. The device of claim 9, wherein said gate insulation layer is comprised of a layer of high-k insulating material.

11. A gate electrode structure for a planar NFET device, consisting of:
    a gate insulation layer comprised of a high-k insulating material positioned on and in contact with an upper surface of a semiconducting substrate;
    a first metal layer made of titanium nitride (TiN) positioned on and in contact with an upper surface of said gate insulation layer, wherein said first metal layer has a thickness of about 1-2 nm;
    a second metal layer made of tantalum nitride (TaN) positioned on and in contact with an upper surface of said first metal layer, wherein said second metal layer has a thickness of about 1-2 nm;
    a third metal layer made of TiAl$_3$ positioned on and in contact with an upper surface of said second metal layer, wherein said third metal layer has a thickness of about 10 nm;

a fourth metal layer made of titanium (Ti) positioned on and in contact with an upper surface of said third metal layer, wherein said fourth metal layer has a thickness of at least about 5 nm; and an aluminum-containing layer positioned on and in contact with an upper surface of said fourth metal layer.

* * * * *